(12) United States Patent
Brunet

(10) Patent No.: US 12,129,078 B2
(45) Date of Patent: Oct. 29, 2024

(54) SURFACE COATING OF DRINKWARE

(71) Applicant: YETI Coolers, LLC, Austin, TX (US)

(72) Inventor: Colby Brunet, Austin, TX (US)

(73) Assignee: YETI Coolers, LLC, Austin, TX (US)

( * ) Notice: Subject to any disclaimer, the term of this patent is extended or adjusted under 35 U.S.C. 154(b) by 0 days.

(21) Appl. No.: 17/685,554

(22) Filed: Mar. 3, 2022

(65) Prior Publication Data

US 2022/0281642 A1 Sep. 8, 2022

Related U.S. Application Data

(60) Provisional application No. 63/156,722, filed on Mar. 4, 2021.

(51) Int. Cl.
*B65D 25/14* (2006.01)
*A47G 19/22* (2006.01)
*B65D 81/38* (2006.01)
*C23C 16/26* (2006.01)
*C23C 16/509* (2006.01)

(52) U.S. Cl.
CPC ......... *B65D 25/14* (2013.01); *A47G 19/2288* (2013.01); *B65D 81/3869* (2013.01); *C23C 16/26* (2013.01); *C23C 16/509* (2013.01)

(58) Field of Classification Search
CPC .............................. B65D 25/14; B65D 81/3869
See application file for complete search history.

(56) References Cited

U.S. PATENT DOCUMENTS

| | | | | |
|---|---|---|---|---|
| 4,134,125 A | * | 1/1979 | Adams | H01L 21/02532 257/E23.122 |
| 2004/0091637 A1 | * | 5/2004 | Gabelnick | C23C 16/509 427/579 |
| 2006/0076395 A1 | * | 4/2006 | Hayes | B65D 1/40 229/400 |
| 2012/0045592 A1 | * | 2/2012 | Kumar | C23C 16/45578 118/723 E |
| 2017/0043916 A1 | * | 2/2017 | Seiders | B65D 47/142 |

FOREIGN PATENT DOCUMENTS

| | | | | |
|---|---|---|---|---|
| CN | 112 046 939 A | | 12/2020 | |
| EP | 2778254 A1 | * | 9/2014 | ......... C23C 14/0641 |
| JP | 2014051745 A | * | 3/2014 | |
| WO | 01/32513 A1 | | 5/2001 | |
| WO | 2010/095011 A1 | | 8/2010 | |

OTHER PUBLICATIONS

JP2014051745, machine translation, 2014. (Year: 2014).*
Sep. 8, 2022—(WO) ISR & Written Opinion—App. No. PCT/US22/18646.
Sep. 24, 2024—EP Examination Report—Application No. 22 712 687.7.

* cited by examiner

*Primary Examiner* — Robert A Vetere
(74) *Attorney, Agent, or Firm* — Banner & Witcoff, Ltd.

(57) ABSTRACT

Systems and methods for coating one or more surfaces of a drinking container with diamond-like carbon. The systems and methods may position a metallic structure of a container into electrically-conducting contact with a first electrode, and use a probe that combines an electrode and gas channel to introduce a precursor gas into an internal compartment of a container for enhanced surface coating of the metallic structure.

11 Claims, 5 Drawing Sheets

SURFACE COATING OF DRINKWARE

CROSS-REFERENCE TO RELATED APPLICATIONS

This application claims priority to U.S. Provisional Application No. 63/156,722 filed on Mar. 4, 2021. The above referenced application is incorporated by reference in its entirety.

BACKGROUND

A drinking container may be formed from a metallic material, such as stainless steel. This metallic material may result in an undesired taste when a beverage stored in the drinking container is consumed. Sol-gel applied coatings, such as ceramic coatings, may be used in certain instances to alleviate this metallic taste issue. However, these coatings can degrade over time due to abrasion from a dishwasher, scrubbing and interaction with utensils. Alternatively, enamel coatings may be used alleviate the metallic taste. However, these enamel coatings are glass-like, and can be quite brittle and degrade over time due to thermal shock and impact from dropping the container. Aspects of this disclosure relate to improved drinking containers and methods for production thereof, which includes an improved coating material.

BRIEF SUMMARY

One aspect of this disclosure may relate to a method of manufacturing a container may include forming a metallic sidewall that extends between a top and a bottom of the container, with the metallic sidewall housing comprising an internal sidewall surface and an external sidewall surface. The method may additionally include forming a metallic base at the bottom of the container that includes an internal base surface and an external base surface. The method may also include forming an opening at the top of the container that extends into an internal compartment configured to store a volume of liquid, where the internal compartment is bounded by the internal sidewall surface and the internal base surface. The method may also position the container structure within a vacuum chamber with a portion of the external base surface or a portion of the external sidewall surface in contact with a first electrode. The method may additionally include inserting a second electrode into the internal compartment such that the second electrode is free of contact with the internal sidewall surface and the internal base surface. The second electrode may be configured to transmit a chemical vapor deposition precursor gas into the internal compartment of the container. The method may additionally include evacuating a mass of gas from the vacuum chamber, transmitting a mass of precursor gas into the internal compartment, and energizing the first and second electrodes to create a plasma and form a deposited layer on the internal sidewall surface and the internal base surface. The deposited layer may be a diamond-like carbon layer, a carbide layer, or a nitride layer. The method according to claim 9, wherein the container is an insulated container, wherein the insulated container includes a sealed vacuum cavity between the internal sidewall surface and the external sidewall surface. The first electrode may be an anode, and the second electrode may be a cathode. The container may have a ratio of a depth or height of the container to a width of the opening is within a range of 1:1 and 5:1. The chemical vapor deposition precursor gas may include a hydrocarbon gas. The second electrode may include an internal channel to transmit the chemical vapor deposition precursor gas into the internal compartment of the container. In addition, the second electrode may include a heating element that is configured to heat the internal sidewall surface prior to injection of the chemical vapor deposition precursor gas.

In another aspect, a container may include a metallic sidewall extending between a top and bottom of the container, and having an internal sidewall surface and an external sidewall surface. The container may additionally include a metallic base at the bottom of the container, which includes an internal base surface and an external base surface. The container may also include an opening at the top of the container, which extends into an internal compartment configured to store a volume of liquid. The internal compartment may be bounded by the internal sidewall surface and the internal base surface. The container may have a diamond-like carbon layer on the internal sidewall surface and the internal base surface. The diamond-like carbon layer may be formed by a chemical vapor deposition process. In some examples, the container may be an insulated container, and may be also a mug or a tumbler. The container may have a ratio of a depth or height of the container to a width of the opening that is greater than 1:1. Optionally, the ratio of a depth or height of the container to a width of the opening may be within a range of 1:1 and 5:1. A thickness of the diamond-like carbon layer may be within a range of 0.01 microns and 10 microns. In addition, the diamond-like carbon layer is formed by: (a) positioning the container within a vacuum chamber with at least a portion of the external base surface or the external sidewall surface in contact with a first electrode; (b) inserting a second electrode into the internal compartment such that the second electrode is free of contact with the internal sidewall surface or the internal base surface, where the second electrode further comprises a channel configured to transmit a chemical vapor deposition precursor gas into the internal compartment of the container; and (c) energizing the first and second electrodes to create a plasma and form the diamond-like carbon layer.

An additional aspect of this disclosure may relate to a method of manufacturing an insulated container, comprising: (a) forming a metallic sidewall extending between a top and a bottom of the insulated container, comprising an internal sidewall surface and an external sidewall surface, where the insulated container includes a sealed vacuum cavity between the internal sidewall surface and the external sidewall surface; (b) forming a metallic base at the bottom of the insulated container, comprising an internal base surface and an external base surface; (c) forming an opening at the top of the insulated container, extending into an internal compartment configured to store a volume of liquid, the internal compartment bounded by the internal sidewall surface and the internal base surface, where a ratio of a depth of the insulated container to a width of the opening is greater than 1:1; (d) positioning the insulated container within a vacuum chamber with a portion of the external base surface or a portion of the external sidewall surface in contact with a first electrode; (e) inserting a second electrode into the internal compartment such that the second electrode is free of contact from the internal sidewall surface and the internal base surface, where the second electrode includes a channel configured to transmit a chemical vapor deposition precursor gas into the internal compartment of the insulated container; (f) evacuating a mass of gas from the vacuum chamber; (g) transmitting a mass of the chemical vapor deposition precursor gas into the internal compartment of the insulated container through the channel in the second electrode; and (h) energizing the first and second electrodes to create a plasma and form a layer of diamond-like carbon on the internal sidewall surface.

This Summary is provided to introduce a selection of concepts in a simplified form that are further described below in the Detailed Description. The Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and not limited in the accompanying figures in which like reference numerals indicate similar elements and in which.

Further, it is to be understood that the drawings may represent the scale of different component of one single embodiment; however, the disclosed embodiments are not limited to that particular scale.

DETAILED DESCRIPTION

Aspects of this disclosure relate to systems and methods for production of a drinking container with a diamond-like carbon (DLC) coating of a metallic substrate of an internal surface of the container.

In the following description of the various embodiments, reference is made to the accompanying drawings, which form a part hereof, and in which is shown by way of illustration various embodiments in which aspects of the disclosure may be practiced. It is to be understood that other embodiments may be utilized and structural and functional modifications may be made without departing from the scope and spirit of the present disclosure.

Figure 1:
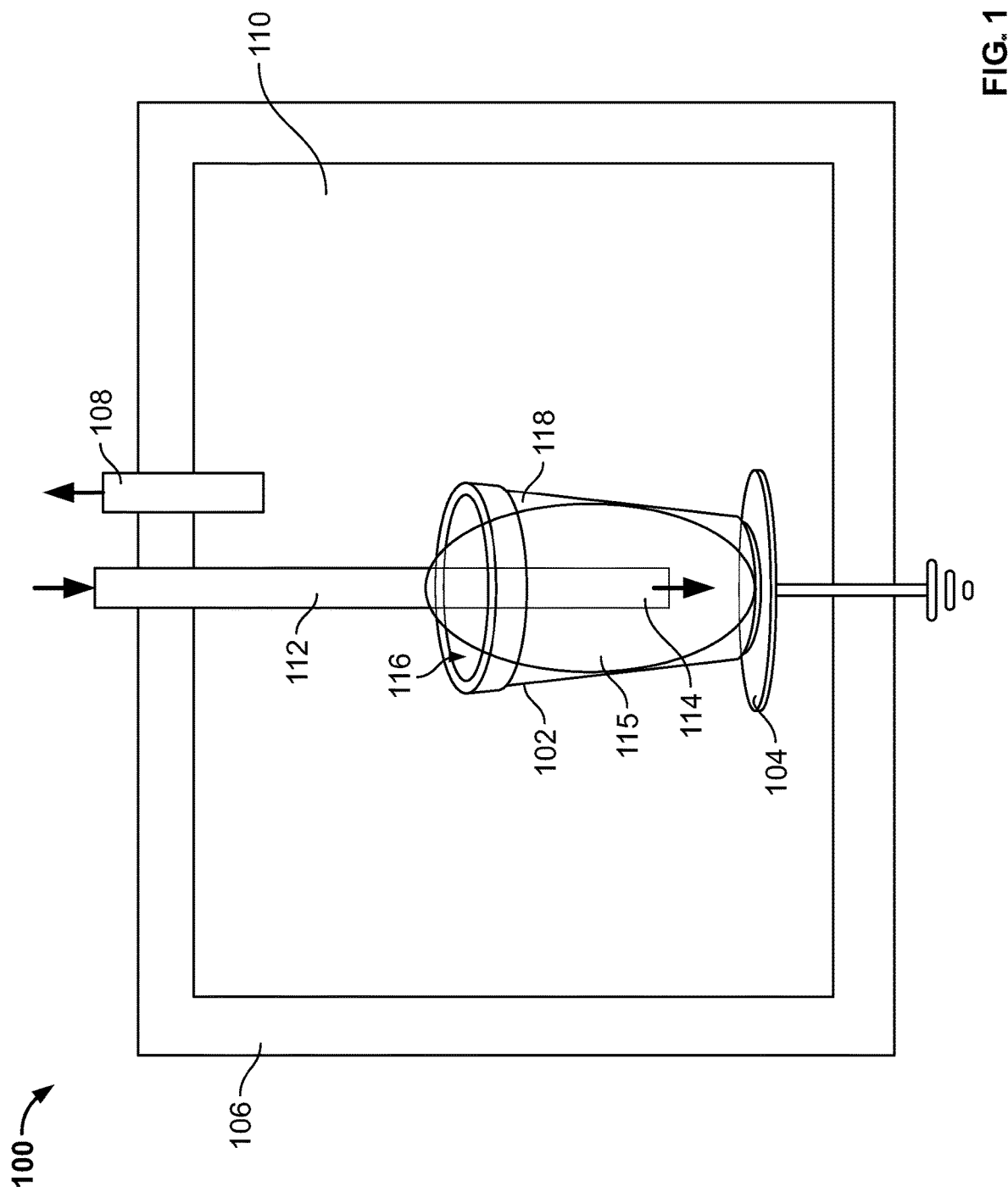
FIG. 1 schematically depicts a coating device for coating an internal surface of a drinking container with a diamond-like carbon layer, according to one or more aspects described herein.

FIG. 1 schematically depicts a coating device 100 for coating an internal surface of a drinking container 102 with a diamond-like carbon layer, according to one or more aspects described herein. In one example, the depicted container 102 is a metallic substrate onto one or more internal surfaces of which are to be applied a diamond-like carbon surface layer. The container 102 may be formed partially or wholly from stainless steel. It is contemplated that other conductive materials, such as metals or alloys may be used to form the container 102, without departing from the scope of these disclosures. In alternative examples, the systems and methods described herein may be used to coat non-metallic containers, such as polymeric, ceramic or fiber-reinforced container materials, or combinations thereof. For example, the container 102 may be partially or wholly formed from aluminum or titanium, among others. In one example, the device 100 may be used to form diamond-like carbon layers on containers of varying geometries. Additionally or alternatively, the device 100 may be used to apply different coating types, including $SiO_2$ (glass), Nitrides (SiN, TiN, AlN, AlTiN, ZrN, CrN, AlTiCN) and Carbides (WC, TiC, SiC). As such, where a diamond-like carbon (DLC) layer is discussed throughout this disclosure, it may be assumed that other coating materials such as those listed above may be used, without departing from the scope of these disclosures.

Previously, surface coating methodologies were unsuitable or unreliable for coating internal surfaces of, e.g., tall and narrow containers, such as drinking containers (e.g., a tumbler or water bottle). These previous deposition methodologies resulted in uneven and/or irregular surface coating thicknesses, and/or resulted in portions of surface areas intended to be coated being left uncoated. Previous deposition methodologies have been incapable of coating internal surfaces of containers with geometries that have a ratio of a container depth (or height) to an opening width of greater than 1:1. Advantageously, the device 100 may be used for deeper containers that have taller heights between base and opening, and which may include irregular internal surface geometries. In one example, device 100 includes a probe 112 that is configured to concentrate a plasma on the inside of a container to be coated, which results in a more reliable and even surface coating. The device 100 is configured to coat one or more internal surfaces of a container with a container depth (i.e. height) to an opening width of greater than 1:1, such as 2:1, 3:1, 5:1, 10:1, 15:1, 20:1, 25:1, among others. In some examples, the ratio the container depth to an opening width may be within a range of 1:1 and 5:1, or within a range of 1:1 and 10:1, or within a range of 1:1 and 25:1. Example container geometries are discussed in further detail in relation to FIGS. 2 and 3, but this disclosure should not be limited to any specific container geometries. The device 100 may be used to apply a surface coating to one or more internal surfaces of a container 102, but the device 100 may also be used to coat external surfaces of a container 102, without departing from the scope of these disclosures.

The container 102 is positioned in contact with a metallic electrode, schematically depicted as element 104. While the electrode 104 is depicted in FIG. 1 as being in contact with the external base of the container 102, it is contemplated that the electrode may, additionally or alternatively, contact the external sidewall of the container 102. As such, the electrode 104 forms an electrically conductive contact with the container 102. The container 102 is positioned within a vacuum chamber 106, and outlet port 108 may be used to evacuate a mass of gas from an internal volume 110 of the vacuum chamber 106. The evacuated gas may be atmospheric air and/or gas remaining following one or more deposition processes. It is contemplated that the outlet port 108 may be connected to any suitable valve and vacuum pump mechanism.

Element 112 may be a probe that combines an inlet tube and an electrode. In one example, the probe 112 may be a first, negative electrode (cathode) and the platform 104 may be a positive electrode (anode). The probe 112 may be free of contact with the container 102 (i.e. the probe 112 does not make contact with the internal sidewall surface or the internal base surface of the container 102). The inlet tube of the probe 112 may include an internal channel that extends to the end 114 of the probe 112. The probe may have a single or multiple outlet ports along a length of the probe 112. The inlet tube or channel of the probe 112 may be used to transmit or pump a chemical vapor deposition precursor gas 115 into an internal cavity or internal compartment 116 of the container 102. This precursor gas 115 is decomposed onto one or more internal surfaces of the internal compartment 116 to form a diamond-like carbon coating or surface layer 118 using a chemical vapor deposition (CVD) process, or RF plasma chemical vapor deposition process. In certain examples, the CVD process may include chemical vapor deposition, plasma-enhanced chemical vapor deposition (PE-CVD), plasma-assisted chemical vapor deposition (PA-CVD). It is contemplated that any chemical vapor deposition conditions of pressure, gas flow rate or amount, gas composition in addition the constituents needed for diamond-like carbon (or another coating type), electrical voltage, current and/or frequency may be used with the device 100, without departing from the scope of this disclosure. In one example, the precursor gas 115 may include a hydrocarbon gas, such as methane and/or ethyne. In certain examples, the precursor gas 115 may be doped with other elements, such as nitrogen, sulfur, tungsten, and/or titanium to form a doped DLC surface coating. In certain examples, a DLC coating deposited by the device 100 is associated with a family of amorphous carbon coatings that are characterized by a predominant bonding type (trigonal sp2 bonding (a-C) or tetrahedral sp3 bonding (ta-C)) and hydrogen content.

Advantageously, the diamond-like carbon coating deposited by the device 100 may prevent an undesirable taste from being experienced by a user of the container 102 when said container 102 is used to store a liquid for drinking. Further advantageously, the DLC surface layer 118 may exhibit mechanical properties that include high hardness and wear resistance, low friction, high corrosion resistance, and high flexibility/crack-resistance. It is contemplated that the systems and methods described herein may result in DLC surface layers 118 of varying physical and chemical characteristics. As such, this disclosure should not be limited to specific values. However, in certain examples, the DLC surface layer 118 deposited on the internal surfaces of the internal compartment 116 may have a thickness of 0.01 microns to 10 microns, a hardness of 5 GPa to 85 GPa, and a coefficient of friction of 0.003 to 0.7.

In one example, the probe 112 may be configured to deliver the precursor gas 115 into the internal compartment 116 such that a more uniform coating of the one or more internal surfaces of the internal compartment 116 can be achieved. Additionally or alternatively, the probe 112 may include a heating element configured to heat one or more internal container surfaces around the internal compartment 116 prior to injection of the precursor gas 115 into the internal compartment 116. As such, the heating element may be configured to remove surface impurities and/or moisture of the one or more surfaces of the internal compartment 116. In alternative examples, the probe 112 may include an electrode and separate piping configured to transmit the precursor gas 115 into the internal compartment 116.

Figure 2:
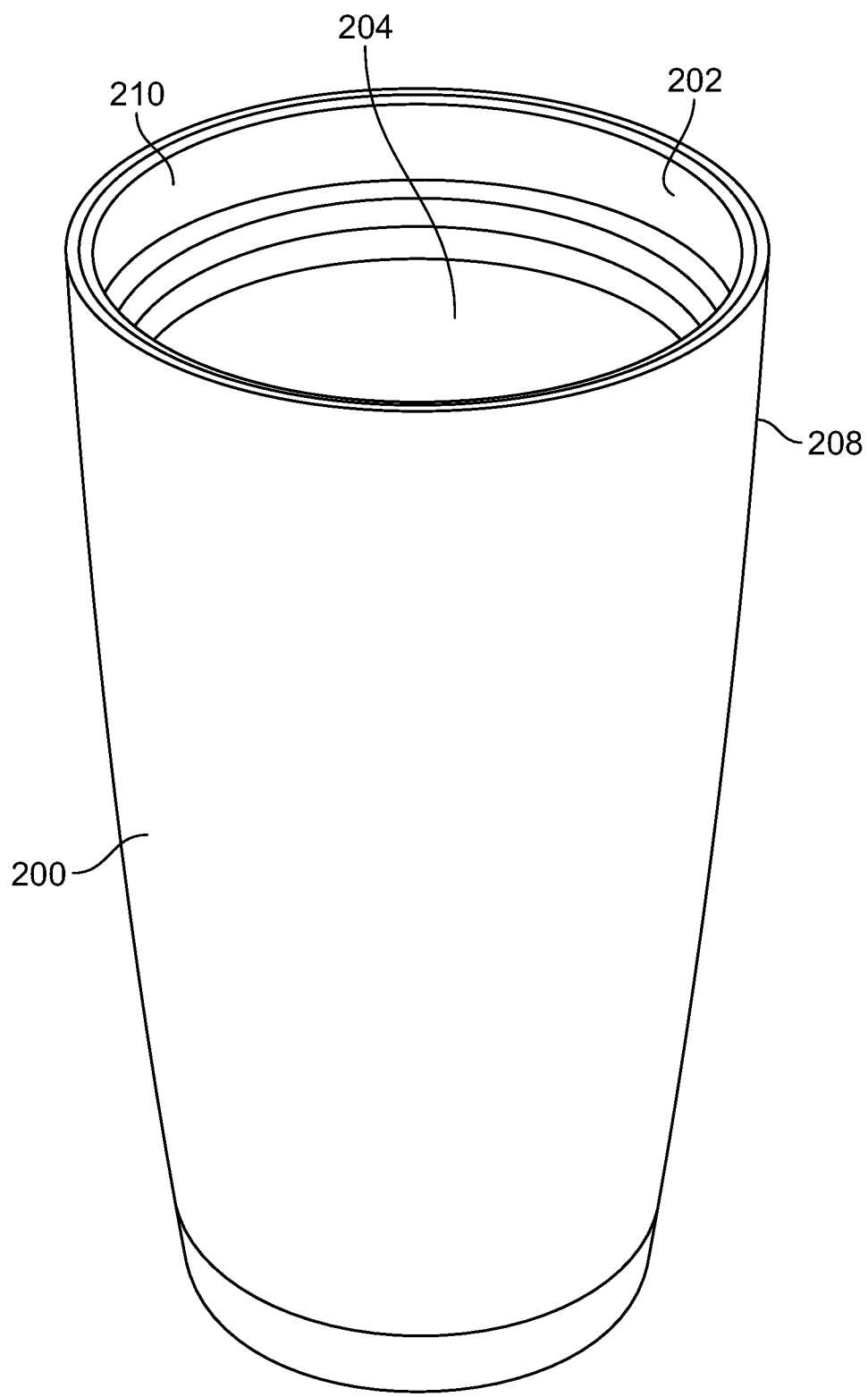
FIG. 2 schematically depicts one example of a container that may be coated with a diamond-like carbon layer using the system and method described in relation to FIG. 1, according to one or more aspects described herein.

FIG. 2 schematically depicts one example of a container 200 that may be coated with a diamond-like carbon layer using the system and method described in relation to FIG. 1, according to one or more aspects described herein. Container 200 may be similar to container 102 and may be configured to store a volume of liquid. The container 200 generally includes a top portion having an opening 202 and an internal reservoir/internal compartment 204 for storing a liquid. In one example, the internal compartment 204 may have an internal volume of at least 100 ml (3.4 fl. oz.), at least 150 ml (5.1 fl. oz.), at least 200 ml (6.8 fl. oz.), at least 400 ml (13.5 fl. oz.), at least 500 ml (16.9 fl. oz.), or at least 1000 ml (33.8 fl. oz.). The opening 202 in the container 200 may have an opening diameter of that ranges between 20 mm (0.86 in.) and 130 mm (5.1 in.). The internal compartment 204 may have an internal diameter that is a same value or a different value to the size of the opening 202, and that internal diameter of the internal compartment 204 may vary along a height of the container 200. Further, the height of the container may range from 70 mm (2.7 in.) and 400 mm (15.7 in.).

Figure 3:
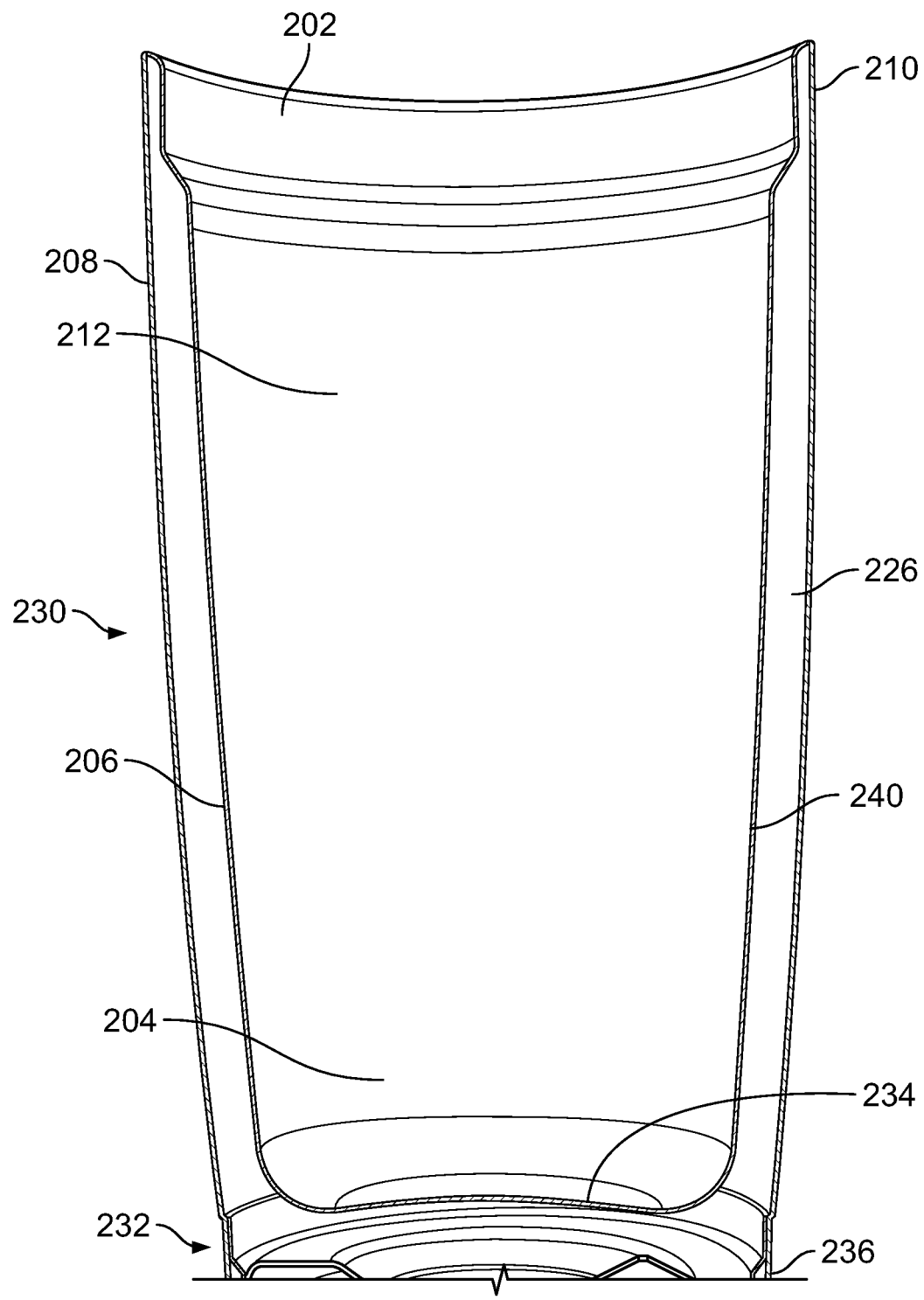
FIG. 3 depicts a cross-sectional view of the container of FIG. 2, according to one or more aspects described herein.

FIG. 3 depicts a cross-sectional view of the container 200, according to one or more aspects described herein. The container 200 includes an inner/internal sidewall 206 and an outer/external sidewall 208. A sealed vacuum cavity 226 may be formed between the inner sidewall 206 and the outer sidewall 208 to form an insulated double-wall structure. Additional or alternative methods of insulating the container 200 are also contemplated. For example, the cavity 226 may be partially or wholly filled with various insulating materials that exhibit low thermal conductivity. As such, the cavity 226 may, in certain examples, be partially or wholly filled with air to form air pockets for insulation or a mass of material such as a polymer material, or a polymer foam material. In one specific example, the cavity 226 may be partially or wholly filled with an insulating foam, such as polystyrene. However, additional or alternative insulating materials may be utilized to partially or wholly fill the cavity 226, without departing from the scope of these disclosures. Moreover, a thickness of the cavity 226 may be embodied with any dimensional value, without departing from the scope of these disclosures.

The inner sidewall 206 may have a first end 210 that defines the opening 202 extending into the internal reservoir 204 for receiving liquid. The outer sidewall 208 may form an outer shell of the container 200. The inner sidewall 206 and the outer sidewall 208 may extend between a top and a bottom of the container, and may be collectively referred to as a metallic sidewall 230. As such, the container 200 may be formed from one or more metals or alloys. In one specific example, the container 200 may be formed from a stainless steel. It is contemplated that any stainless steel variety may be utilized, without departing from the scope of these disclosures.

The container 200 may be made up of a metallic sidewall 230 that includes the internal sidewall 206 and the external sidewall 208. The container 200 may additionally include a metallic base 232 at the bottom of the container 200. This metallic base 232 may include an internal base surface 234 and an external base surface 236. The internal compartment/reservoir 204 may be bounded by the internal sidewall 206 and the internal base surface 234.

When positioned within the device 100, one or more of the external sidewall 208 and the external base surface 236 may be positioned in contact with the electrode 104. The device 100 may deposit a DLC layer 240 on the internal sidewall 206 and internal base surface 234. This DLC layer 240 may have a uniform thickness or a variable thickness. Further, the DLC layer 240 may have different thickness values, dependent upon the conditions used to form the DLC layer 240.

It is contemplated that while FIG. 2 and FIG. 3 depicts one implementation of a container 200 in the form of a tumbler, the systems and methods described herein may be utilized with containers having different geometries (different heights, widths, depths). For example, the systems and methods described herein may be utilized to deposit a DLC layer on one or more internal surfaces of a metallic mug, or water bottle, among others.

Figure 4:
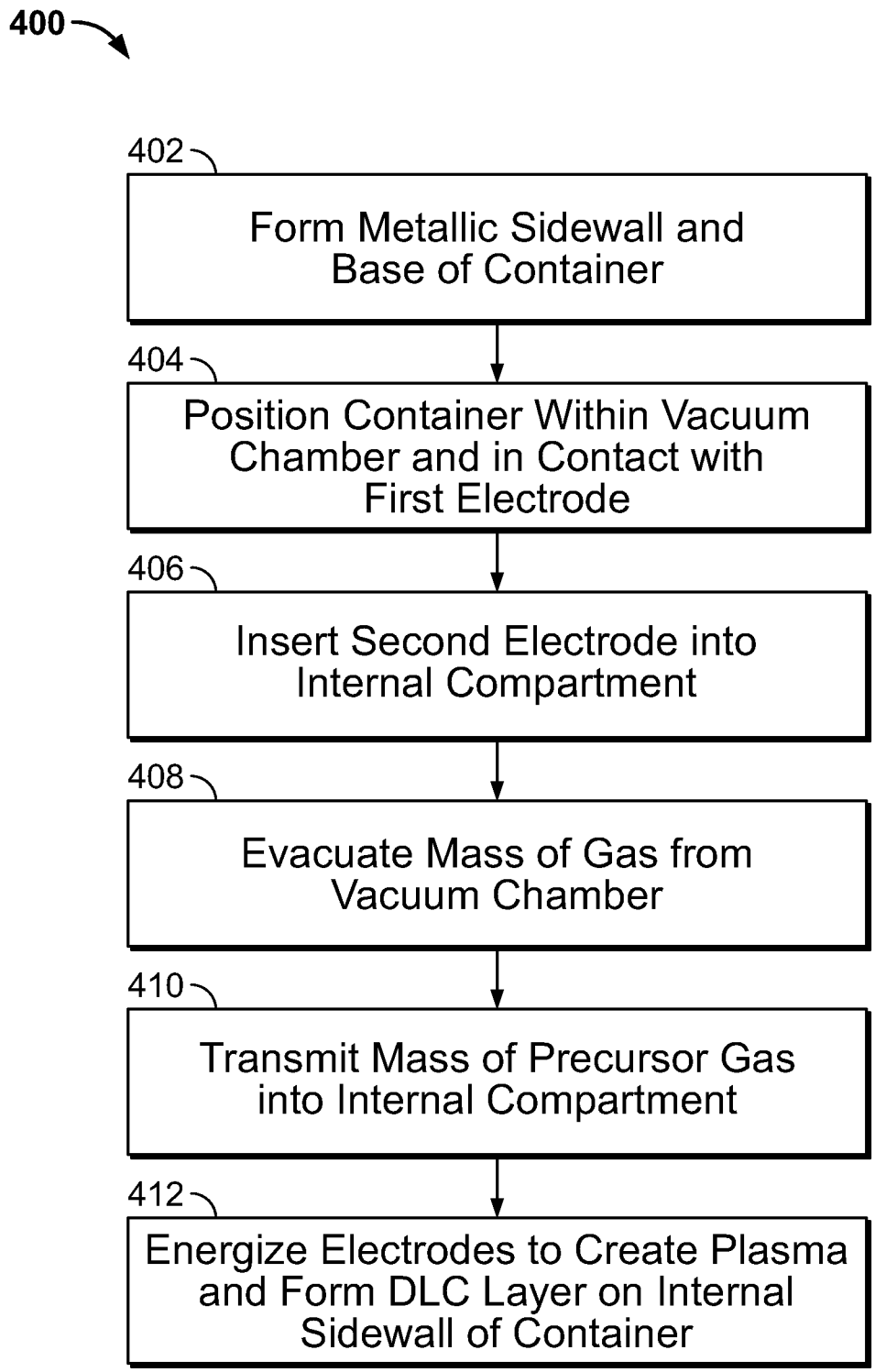
FIG. 4 is a flowchart diagram of a process for coating a layer of diamond-like carbon onto one or more internal surfaces of a metallic structure of a drinking container, according to one or more aspects described herein.

FIG. 4 is a flowchart diagram of a process 400 for coating a layer of diamond-like carbon onto one or more internal surfaces of a metallic structure of a drinking container, according to one or more aspects described herein. Accordingly, process 400 may utilize the device 100 described in relation to FIG. 1. In one example, one or more processes may be executed at block 402 to form a metallic sidewall and base of a container. These one or more processes may form a container similar to container 102 and/or container 200. Accordingly, the formed metallic sidewall and base may be similar to elements 230 and 232.

One or more processes may be executed at block 404 to position a container, such as container 102 within a vacuum chamber, such as a vacuum chamber 106. Further, the container 102 may be positioned in electrically conductive contact with electrode 104, which may be an anode.

One or more processes may be executed at block 406 two insert a second electrode into an internal compartment of a container. This second electrode may be probe 112, and the internal compartment may be internal compartment 116 of container 102. Further, one or more processes may be executed at block 408 to evacuate a mass of gas from the vacuum chamber, such as vacuum chamber 106. This mass of gas may be remaining precursor gas 115 following a coating process, or may be a mass of atmospheric gas, such as air.

One or more processes may be executed at block 410 to transmit a mass of precursor gas 115 into an internal compartment of the container, such as internal compartment 116 of container 102. Further, one or more processes may be executed at block 412 to energize the first and second electrodes, such as electrodes 112, 104. This energizing will form a plasma and subsequently a DLC layer 118 on one or more internal sidewalls of the container 102.

Moreover, a thickness of the coating of the internal compartment or cavity 116 of the container 102 may be embodied with any dimensional value, without departing from the scope of these disclosures. Also, an inner surface of one or more of the inner sidewall 206 or the outer sidewall 208 of the container 102 may comprise a silvered surface, copper plated, or covered with thin aluminum foil configured to reduce heat transfer by radiation. It is also contemplated that a lid that is arranged to engage the opening of the container 102 may be coated using the techniques described herein.

Figure 5:
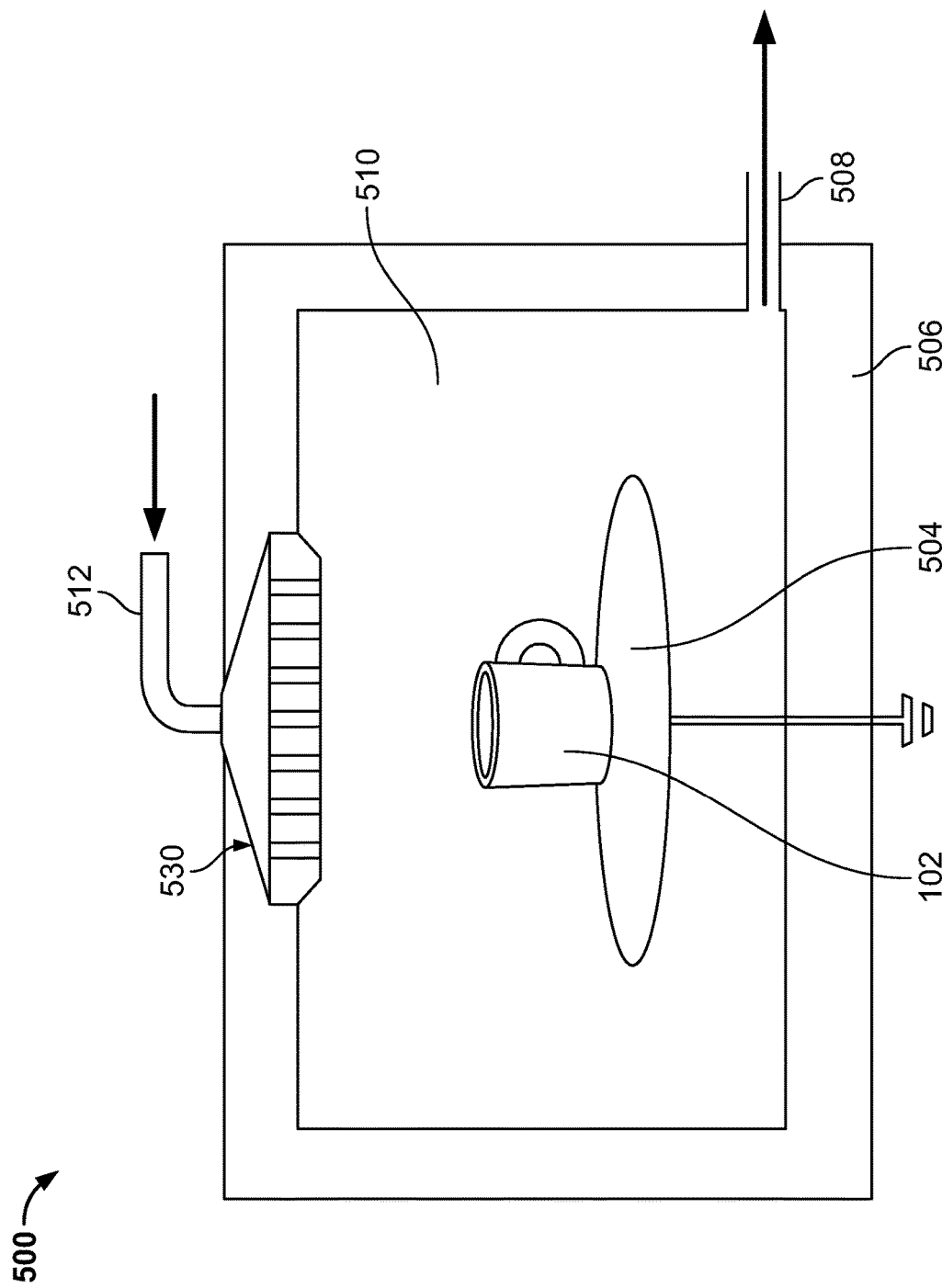
FIG. 5 schematically depicts another coating device for coating an internal surface of a drinking container with a diamond-like carbon layer, according to one or more aspects described herein.

FIG. 5 schematically depicts another coating device 500 for coating an internal surface of a drinking container 102 with a diamond-like carbon layer, according to one or more aspects described herein. In particular, device 500 may be used to generate a surface coating using a glow-discharge plasma. Accordingly, device 500 may utilize a form of physical vapor deposition. It is contemplated that device 500 may be utilized with alternative forms of physical vapor deposition, without departing from the scope of these disclosures. For example, device 500 may utilize cathodic arc deposition, electron-beam physical vapor deposition, evaporative deposition, close-space sublimation, pulsed laser deposition, pulsed electron deposition, among others. Similar to coating device 100, device 500 may additionally or alternatively be used to apply a coating of a different material, such as one or the materials discussed in this disclosure. In one example, the device 500 includes a vacuum chamber 506 similar to vacuum chamber 106. A mass of gas is evacuated from an internal volume 510 of the chamber 506 by outlet port 508, which may be similar to outlet port 108 and connected to a vacuum pump and valve system. The metallic container 102 may be positioned in electrically conductive contact with an electrode 504. The device 500 may utilize an RF glow-discharge device 530. This glow discharge device 530 is used to form a glow discharge plasma from a gas that is introduced through inlet 512. The electrode of the device 530 may be formed from a material to be coated onto the container 102. Accordingly, device 530 may allow for coating of one or more internal and/or external surfaces of the container 102 by glow-discharge sputtering. In particular, the electrode (cathode) of the device 530 may be ablated by application of a voltage between the anode of the electrode 504 and the cathode of the device 530. It is contemplated that the coating device 500 may utilize any voltage, current, and frequency values, without departing from the scope of these disclosures.

The present disclosure is disclosed above and in the accompanying drawings with reference to a variety of examples. The purpose served by the disclosure, however, is to provide examples of the various features and concepts related to the disclosure, not to limit the scope of the invention. One skilled in the relevant art will recognize that numerous variations and modifications may be made to the examples described above without departing from the scope of the present disclosure.

Exemplary Clauses:

1. A method of manufacturing a container, comprising:
    forming a metallic sidewall extending between a top and a bottom of the container, comprising an internal sidewall surface and an external sidewall surface;
    forming a metallic base at the bottom of the container, comprising an internal base surface and an external base surface;
    forming an opening at the top of the container, extending into an internal compartment configured to store a volume of liquid, the internal compartment bounded by the internal sidewall surface and the internal base surface;
    depositing a layer of diamond-like carbon on at least one of the internal sidewall surface by chemical vapor deposition.

2. A container, comprising:
    a metallic sidewall extending between a top and a bottom of the container, comprising an internal sidewall surface and an external sidewall surface;
    a metallic base at the bottom of the container, comprising an internal base surface and an external base surface;
    an opening at the top of the container, extending into an internal compartment configured to store a volume of liquid, the internal compartment bounded by the internal sidewall surface and the internal base surface;
    a diamond-like carbon layer on the internal sidewall surface and the internal base surface, wherein the diamond-like carbon layer is formed by chemical vapor deposition.

3. A method of manufacturing a container, comprising:
    forming a metallic sidewall extending between a top and a bottom of the container, comprising an internal sidewall surface and an external sidewall surface;
    forming a metallic base at the bottom of the container, comprising an internal base surface and an external base surface;
    forming an opening at the top of the container, extending into an internal compartment configured to store a volume of liquid, the internal compartment bounded by the internal sidewall surface and the internal base surface;

positioning the container structure within a vacuum chamber with at least a portion of the external base surface or the external sidewall surface in contact with a first electrode;

inserting a second electrode into the internal compartment such that it does not make contact with the internal sidewall surface or the internal base surface, wherein the second electrode further comprises a channel configured to transmit a chemical vapor deposition precursor gas into the internal compartment of the container;

evacuating a mass of gas from the vacuum chamber;

transmitting a mass of precursor gas into the internal compartment;

energizing the first and second electrodes to create a plasma and form a deposited layer on the internal sidewall surface and the internal base surface.

4. The method according to clause 3, wherein the deposited layer is a diamond-like carbon layer.

5. The method according to clause 3, wherein the deposited layer is a carbide layer.

6. The method according to clause 3, wherein the deposited layer is a silicon layer.

7. The method according to clause 3, wherein the deposited layer is a nitride layer.

8. The method according to clause 3, wherein the container is an insulated container.

9. The method according to clause 3, wherein the container is a mug.

10. The method according to clause 3, wherein the first electrode is an anode and the second electrode is a cathode.

11. A container, comprising:
a metallic sidewall extending between a top and a bottom of the container, comprising an internal sidewall surface and an external sidewall surface;
a metallic base at the bottom of the container, comprising an internal base surface and an external base surface;
an opening at the top of the container, extending into an internal compartment configured to store a volume of liquid, the internal compartment bounded by the internal sidewall surface and the internal base surface;
a diamond-like carbon layer on the internal sidewall surface and the internal base surface, wherein the diamond-like carbon layer is formed by:
positioning the container structure within a vacuum chamber with at least a portion of the external base surface or the external sidewall surface in contact with a first electrode;
inserting a second electrode into the internal compartment such that it does not make contact with the internal sidewall surface or the internal base surface, wherein the second electrode further comprises a channel configured to transmit a chemical vapor deposition precursor gas into the internal compartment of the container; and
energizing the first and second electrodes to create a plasma and form the diamond-like carbon layer.

What is claimed:

1. A method of manufacturing a container, comprising:
forming a metallic sidewall extending between a top and a bottom of the container, comprising an internal sidewall surface and an external sidewall surface;
forming a metallic base at the bottom of the container, comprising an internal base surface and an external base surface;
forming an opening at the top of the container, extending into an internal compartment configured to store a volume of liquid, the internal compartment bounded by the internal sidewall surface and the internal base surface;
positioning the container within a vacuum chamber with a portion of the external base surface or a portion of the external sidewall surface in contact with a first electrode, wherein the first electrode is grounded and is at a ground potential;
inserting a second electrode into the internal compartment such that the second electrode is free of contact from the internal sidewall surface and the internal base surface, wherein the second electrode is configured to transmit a chemical vapor deposition precursor gas into the internal compartment of the container, wherein the second electrode includes a heating element that is configured to heat the internal sidewall surface prior to injection of the chemical vapor deposition precursor gas;
evacuating a mass of gas from the vacuum chamber;
transmitting a mass of the chemical vapor deposition precursor gas into the internal compartment of the container; and
energizing the first and second electrodes to create a plasma and form a deposited layer on the internal sidewall surface.

2. The method according to claim 1, wherein the deposited layer is also formed on the internal base surface of the container.

3. The method according to claim 1, wherein the deposited layer is a diamond-like carbon layer.

4. The method according to claim 1, wherein the deposited layer is a carbide layer.

5. The method according to claim 1, wherein the deposited layer is a nitride layer.

6. The method according to claim 1, wherein the container is an insulated container, wherein the insulated container includes a sealed vacuum cavity between the internal sidewall surface and the external sidewall surface.

7. The method according to claim 1, wherein the first electrode is an anode and the second electrode is a cathode.

8. The method according to claim 1, wherein a ratio of a depth of the container to a width of the opening is within a range of 1:1 and 5:1.

9. The method according to claim 1, wherein the chemical vapor deposition precursor gas includes a hydrocarbon gas.

10. The method according to claim 1, wherein the second electrode includes an internal channel to transmit the chemical vapor deposition precursor gas into the internal compartment of the container.

11. A method of manufacturing an insulated container, comprising:
forming a metallic sidewall extending between a top and a bottom of the insulated container, comprising an internal sidewall surface and an external sidewall surface, wherein the insulated container includes a sealed vacuum cavity between the internal sidewall surface and the external sidewall surface;

forming a metallic base at the bottom of the insulated container, comprising an internal base surface and an external base surface;

forming an opening at the top of the insulated container, extending into an internal compartment configured to store a volume of liquid, the internal compartment bounded by the internal sidewall surface and the internal base surface, wherein a ratio of a depth of the insulated container to a width of the opening is greater than 1:1;

positioning the insulated container within a vacuum chamber with a portion of the external base surface or a portion of the external sidewall surface in contact with a first electrode, wherein the first electrode is grounded and is at a ground potential;

inserting a second electrode into the internal compartment such that the second electrode is free of contact from the internal sidewall surface and the internal base surface, wherein the second electrode includes a channel configured to transmit a chemical vapor deposition precursor gas into the internal compartment of the insulated container, wherein the second electrode includes a heating element that is configured to heat the internal sidewall surface prior to injection of the chemical vapor deposition precursor gas;

evacuating a mass of gas from the vacuum chamber;

transmitting a mass of the chemical vapor deposition precursor gas into the internal compartment of the insulated container through the channel in the second electrode; and energizing the first and second electrodes to create a plasma and form a layer of diamond-like carbon on the internal sidewall surface.

* * * * *